(12) United States Patent
Ma et al.

(10) Patent No.: US 9,746,703 B2
(45) Date of Patent: Aug. 29, 2017

(54) PANEL ASSEMBLY

(71) Applicants: Interface Optoelectronics (ShenZhen) Co., Ltd., Shenzhen (CN); General Interface Solution Limited, Miaoli County (TW)

(72) Inventors: Chen-Yun Ma, Guangdong (CN); Kuo-Tung Liao, Guangdong (CN); Chia-Jung Fan, Guangdong (CN)

(73) Assignees: INTERFACE OPTOELECTRONICS (SHENZHEN) CO., LTD., Shenzhen (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 14/828,512

(22) Filed: Aug. 17, 2015

(65) Prior Publication Data

US 2016/0299375 A1  Oct. 13, 2016

(30) Foreign Application Priority Data

Apr. 13, 2015  (CN) .......................... 2015 1 0173441

(51) Int. Cl.
  *G02F 1/1345* (2006.01)
  *G02F 1/1333* (2006.01)
  *H05K 1/02* (2006.01)

(52) U.S. Cl.
  CPC .... *G02F 1/133308* (2013.01); *G02F 1/13452* (2013.01); *H05K 1/02* (2013.01); *G02F 2001/133314* (2013.01)

(58) Field of Classification Search
  CPC .................................................. G02F 1/13452
  See application file for complete search history.

(56) References Cited

U.S. PATENT DOCUMENTS

2005/0259387 A1* 11/2005 Sung ..................... G06F 1/1601
  361/679.21
2006/0203515 A1* 9/2006 Fujikawa ............. G02B 6/0088
  362/615

* cited by examiner

*Primary Examiner* — Phu Vu
(74) *Attorney, Agent, or Firm* — CKC & Partners Co., Ltd.

(57) ABSTRACT

A panel assembly includes a frame, a cell module, a retaining structure, and a flexible circuit board. The frame has a first surface and a second surface respectively located at opposite sides of the frame. The cell module and the retaining structure are respectively disposed on the first and second surfaces. The flexible circuit board is connected to the cell module and bended to extend over the second surface. The flexible circuit board has a through hole having a passing zone and an inwardly reduced zone communicated with each other. A part of the retaining structure extends from the second surface to a side of the flexible circuit board distal to the second surface via the inwardly reduced zone for preventing the flexible circuit board from moving away from the second surface. The passing zone is configured for the retaining structure to pass through.

9 Claims, 6 Drawing Sheets

PANEL ASSEMBLY

RELATED APPLICATIONS

This application claims priority to Chinese Application Serial Number 201510173441.6, filed Apr. 13, 2015, which is herein incorporated by reference.

BACKGROUND

1. Technical Field

The present disclosure relates to a panel assembly, and more particularly, to the panel assembly applied in a LCD (Liquid Crystal Display).

2. Description of Related Art

In recent years, with the rapid development of the electronics and information industry, the products become increasingly sophisticated. For the modern personal computers, in addition to seeking faster and more powerful computing units and a wide range of peripheral equipments to meet user needs, lightweight and compact portable computers are one of the key developments in the industry. For example, liquid crystal displays are relatively compact in size and light in weight and also have advantages such as high definition, low driving voltage, low power consumption, and a wide range of applications, and thus are widely applicable portable televisions, mobile phones, camcorders, notebook computers, desktop monitors, and other consumer electronics products and become the mainstream of the displays.

With the refinement of technology, the development of the LCDs are gradually targeted toward even lighter, thinner, larger, and of narrower borders. To meet these requirements, the original safety designs of all related components must still be achieved but within the even limited space. For example, a conventional positioning method is performed to bend and adhere a flexible circuit board to a frame. But under the circumstances that the space for accommodating the components is limited, the adhering area of the flexible circuit board becomes insufficient, which increases the recovery potential of the bended flexible circuit board. In order to strengthen the fixation of the flexible circuit board, a heat staking process is developed. Heat melt designs can effectively solve the problem of recovery of the bended flexible circuit board and increase the convenience of positioning.

However, this approach of improving the recovery of the bended flexible circuit board is by melting the flexible circuit board with the frame. The frame itself and the materials therein are vulnerable to damage in the heat staking process.

SUMMARY

In order to prevent the bended flexible circuit board from recovering and prevent the frame from damages, the disclosure provides a panel assembly.

According to an embodiment, the disclosure provides a panel assembly. The panel assembly includes a frame, a cell module, a retaining structure, and a flexible circuit board. The frame has a first surface and a second surface. The first surface and the second surface are respectively located at opposite sides of the frame. The cell module is disposed on the first surface. The retaining structure is disposed on the second surface. The flexible circuit board is connected to the cell module and bended to extend over the second surface. The flexible circuit board has a through hole. The through hole has a passing zone and an inwardly reduced zone communicated with each other. A part of the retaining structure extends from the second surface to a side of the flexible circuit board distal to the second surface via the inwardly reduced zone, so as to prevent the flexible circuit board from moving away from the second surface. The passing zone is configured for the retaining structure to pass through.

In an embodiment of the disclosure, the retaining structure includes a neck portion and a head portion. The neck portion is connected to the second surface and extends to the side of the flexible circuit board distal to the second surface via the inwardly reduced zone. The head portion is connected to the neck portion and configured to prevent the flexible circuit board from moving away from the second surface, in which the passing zone is configured for the head portion to pass through.

In an embodiment of the disclosure, a largest width of the head portion is greater than a largest width of the inwardly reduced zone.

In an embodiment of the disclosure, the shape of the passing zone and the shape of the head portion are matched with each other.

In an embodiment of the disclosure, the shape of the passing zone and the shape of the head portion are substantially circular.

In an embodiment of the disclosure, the shape of the passing zone and the shape of the head portion are substantially triangular.

In an embodiment of the disclosure, the shape of the passing zone and the shape of the head portion are substantially rectangular.

In an embodiment of the disclosure, the flexible circuit board has a bended portion, and the passing zone is located between the bended portion and the inwardly reduced zone.

In an embodiment of the disclosure, the cell module includes a thin-film transistor substrate and a color filter substrate. The thin-film transistor substrate is disposed on the first surface and has a bonding surface facing away from the first surface. The color filter substrate is disposed on the bonding surface. The flexible circuit board is connected to a part of the bonding surface that is not covered by the color filter substrate.

In an embodiment of the disclosure, the frame and the retaining structure are integrally formed.

Accordingly, in the panel assembly of the disclosure, the retaining structure is disposed on the back surface (i.e., the second surface) of the frame, and the through hole for the retaining structure to pass through is formed on the flexible circuit board. Specifically, the passing zone of the through hole is configured for the head portion of the retaining structure to pass through, and the inwardly reduced zone of the through hole does not allow the head portion to pass through. Therefore, when the head portion passes through the passing zone and the flexible circuit board is moved to locate the retaining structure at the inwardly reduced zone, the head portion can stop the flexible circuit board moving away from the second surface, so as to achieve the purpose of preventing the bended flexible circuit board from recovering. In addition, the design of the disclosure used to position the flexible circuit board does not damage the frame.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
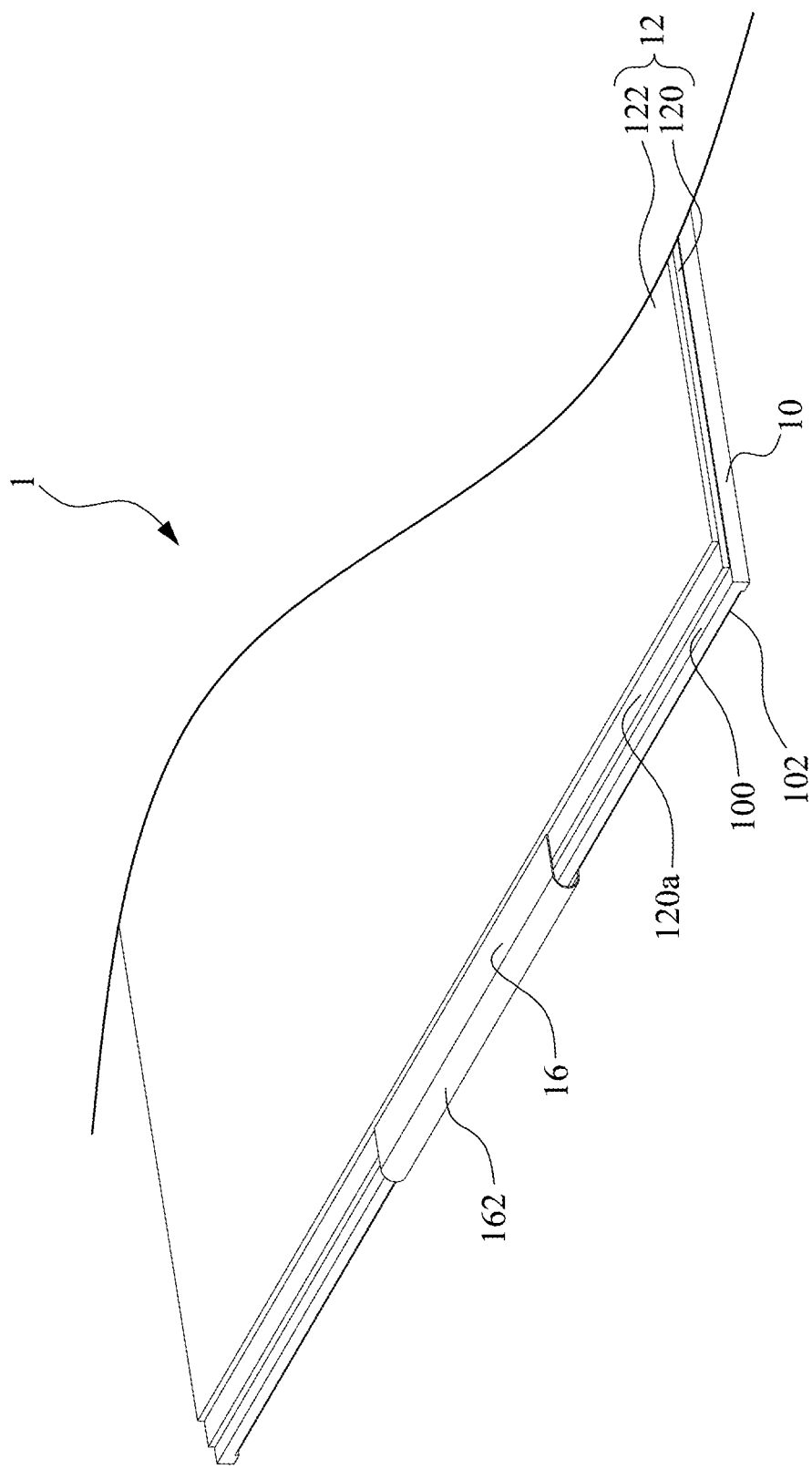
FIG. 1 is a perspective view of a panel assembly according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
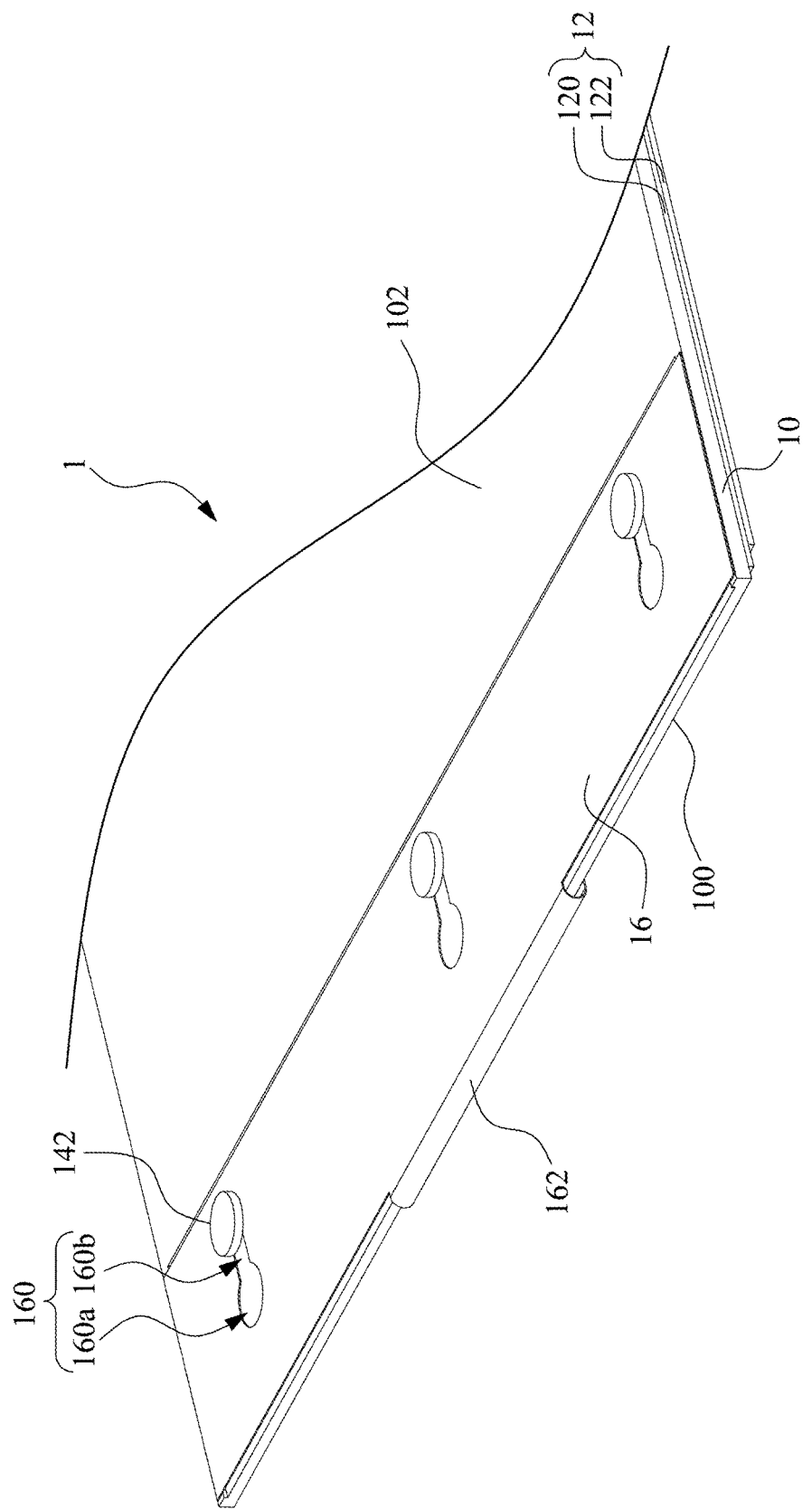
FIG. 2 is another perspective view of the panel assembly in FIG. 1.
Figure 3:
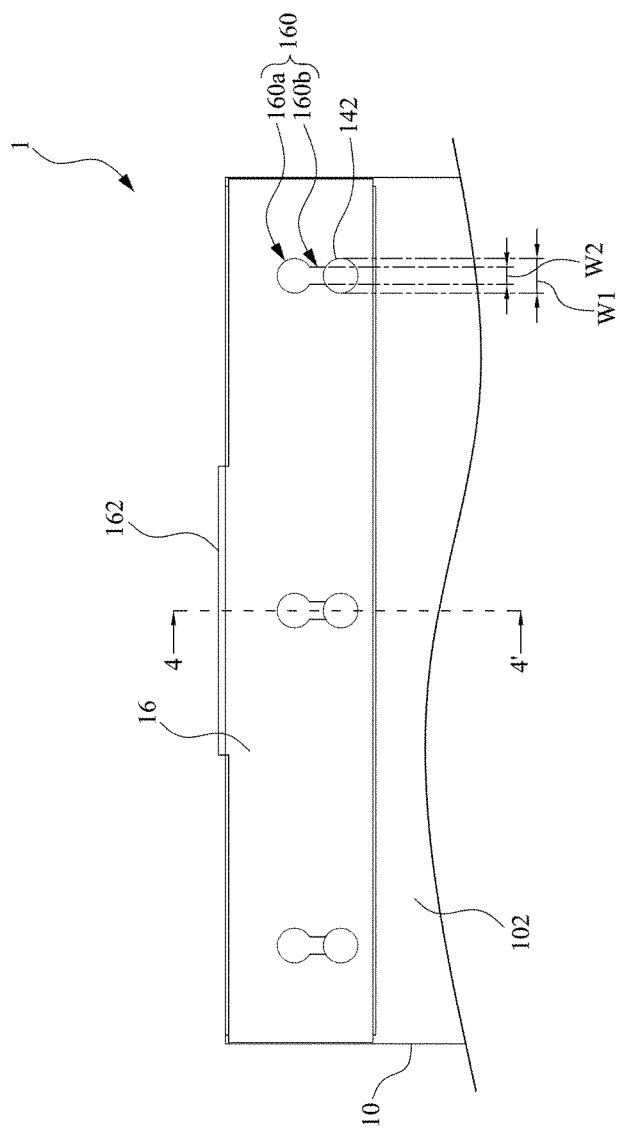
FIG. 3 is a bottom view of the panel assembly in FIG. 1.
Figure 4:
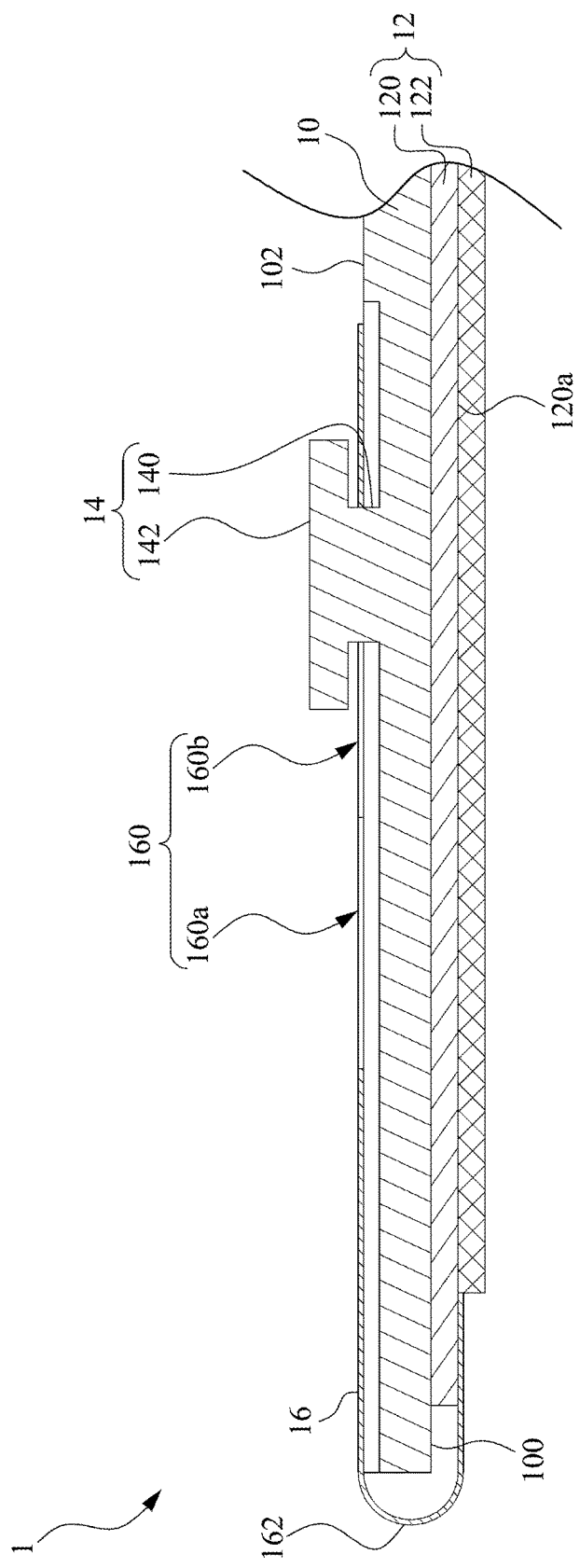
FIG. 4 is a cross-sectional view of the panel assembly in FIG. 3 along line 4-4'.

Referring to FIG. 1 to FIG. 4. FIG. 1 is a perspective view of a panel assembly 1 according to an embodiment of the disclosure. FIG. 2 is another perspective view of the panel assembly 1 in FIG. 1. FIG. 3 is a bottom view of the panel assembly 1 in FIG. 1. FIG. 4 is a cross-sectional view of the panel assembly 1 in FIG. 3 along line 4-4'.

As shown in FIG. 1 to FIG. 4, in the embodiment, the panel assembly 1 is applied in a LCD (not shown). In practical applications, the LCD can further include a backlight module (not shown). The backlight module at least includes light sources, a light guide plate, a reflector, and optical films disposed between the light guide plate and the panel assembly 1. The panel assembly 1 of the embodiment at least includes a frame 10, a cell module 12, a retaining structure 14, and a flexible circuit board 16. One purpose of the disclosure is to improve the fixing design of the flexible circuit board 16 of the panel assembly 1, so the structures of the backlight module and the connection relationships between the backlight module and the panel assembly 1 are not discussed here.

The frame 10 of the panel assembly 1 has a first surface 100 and a second surface 102. The first surface 100 and the second surface 102 of the frame 10 are respectively located at opposite sides of the frame 10. The cell module 12 of the panel assembly 1 is disposed on the first surface 100. As shown in FIG. 4, the cell module 12 of the panel assembly 1 includes a thin-film transistor substrate 120 and a color filter substrate 122. The thin-film transistor substrate 120 is disposed on the first surface 100 of the frame 10 and has a bonding surface 120a facing away from the first surface 100. The color filter substrate 122 is disposed on the bonding surface 120a of the thin-film transistor substrate 120. The flexible circuit board 16 is connected to a part of the bonding surface 120a that is not covered by the color filter substrate 122, and is bended to extend over the second surface 102.

The retaining structure 14 of the panel assembly 1 is disposed on the second surface 102 of the frame 10. As shown in FIG. 2 and FIG. 3, the flexible circuit board 16 of the panel assembly 1 has a plurality of through holes 160. Each of the through holes 160 has a passing zone 160a and an inwardly reduced zone 160b communicated with each other. The passing zone 160a of the through hole 160 is configured for the retaining structure 14 to pass through. In addition, a part of the retaining structure 14 extends from the second surface 102 to a side of the flexible circuit board 16 distal to the second surface 102 via the inwardly reduced zone 160b, so as to prevent the flexible circuit board 16 from separating from the retaining structure 14 and moving away from the second surface 102 of the frame 10. Therefore, the passing zone 160a of the through hole 160 allows the retaining structure 14 to pass through, but the inwardly reduced zone 160b of the through hole 16 does not allow the retaining structure 14 to pass through. Moreover, after the retaining structure 14 passes through the through hole 160 via the passing zone 160a, an assembling staff can selectively locate the retaining structure 14 at the passing zone 160a or the inwardly reduced zone 160b by moving the flexible circuit board 16.

In the embodiment, in the direction that is perpendicular to the arrangement direction of the passing zone 160a and the inwardly reduced zone 160b (i.e., the horizontal direction in FIG. 3), a width of the passing zone 160a is greater than a width of the inwardly reduced zone 160b, and the shape of the through hole 160 is similar to a keyhole, but the disclosure is not limited in this regard.

Referring to FIG. 4, in detail, the retaining structure 14 includes a neck portion 140 and a head portion 142. The neck portion 140 of the retaining structure 14 is connected to the second surface 102 of the frame 10, and extends to the side of the flexible circuit board 16 distal to the second surface 102 via the inwardly reduced zone 160b of the through hole 160. The head portion 142 of the retaining structure 14 is connected to the neck portion 140. The passing zone 160a of the through hole 160 is configured for the head portion 142 to pass through, and the inwardly reduced zone 160b of the through hole 160 is configured for the neck portion 140 to pass through. Therefore, after the head portion 142 passes through the through hole 160 via the passing zone 160a, the assembling staff can selectively locate the neck portion 140 at the passing zone 160a or the inwardly reduced zone 160b by moving the flexible circuit board 16. Furthermore, the inwardly reduced zone 160b of the through hole 160 does not allow the head portion 142 to pass through. For example, in the direction that is perpendicular to the arrangement direction of the passing zone 160a and the inwardly reduced zone 160b (i.e., the horizontal direction in FIG. 3), the largest width W1 of the head portion 142 is greater than the largest width W2 of the inwardly reduced zone 160b. Therefore, after the head portion 142 passes through the passing zone 160a and the flexible circuit board 16 is moved to locate the neck portion 140 at the inwardly reduced zone 160b, the head portion 142 can prevent the flexible circuit board 16 from separating from the retaining structure 14 and moving away from the second surface 102.

In the embodiment, a projection of the head portion 142 on the second surface 102 covers a projection of the neck portion 140 on the second surface 102, and the shape of the retaining structure 14 is similar to a thumbtack, but the disclosure is not limited in this regard.

In the embodiment, in the direction that is perpendicular to the arrangement direction of the passing zone 160a and the inwardly reduced zone 160b (i.e., the horizontal direction in FIG. 3), a width of the neck portion 140 is matched with a width of the inwardly reduced zone 160b. Therefore, during moving the flexible circuit board 16 to locate the neck portion 140 at the inwardly reduced zone 160b, the neck portion 140 can be guided by the inwardly reduced zone 160b, so as to increase the assembly stability between the retaining structure 14 and the flexible circuit board 16.

In addition, as shown in FIG. 3, the flexible circuit board 16 has a bended portion 162, and the passing zone 160a is located between the bended portion 162 and the inwardly reduced zone 160b. Therefore, when the part of the flexible circuit board 16 located over the second surface 102 recovers toward the bended portion 162, the neck portion 140 of the retaining structure 14 will naturally abut against the end of the inwardly reduced zone 160b distal to the passing zone 160a. That is, the head portion 142 of the retaining structure 14 will not be aligned with the passing zone 160a to leave the through hole 160 unless the part of the flexible circuit board 16 located over the second surface 102 is intentionally moved toward the retaining structure 14 from the bended portion 162.

In the embodiment, the frame 10 and the retaining structure 14 have the same material. That is, the frame 10 and the retaining structure 14 are integrally formed, but the disclosure is not limited in this regard.

As shown in FIG. 3, in the embodiment, the shape of the passing zone 160a and the shape of the head portion 142 are matched with each other. Therefore, only when the assembling staff moves the flexible circuit board 16 to align the passing zone 160a with the head portion 142, the head portion 142 can pass through the passing zone 160a or leave the through hole 160, so as to prevent the flexible circuit board 16 from easily separating from the retaining structure 14.

In the embodiment, the shape of the passing zone 160a and the shape of the head portion 142 are substantially circular, but the disclosure is not limited in this regard.

Figure 5:
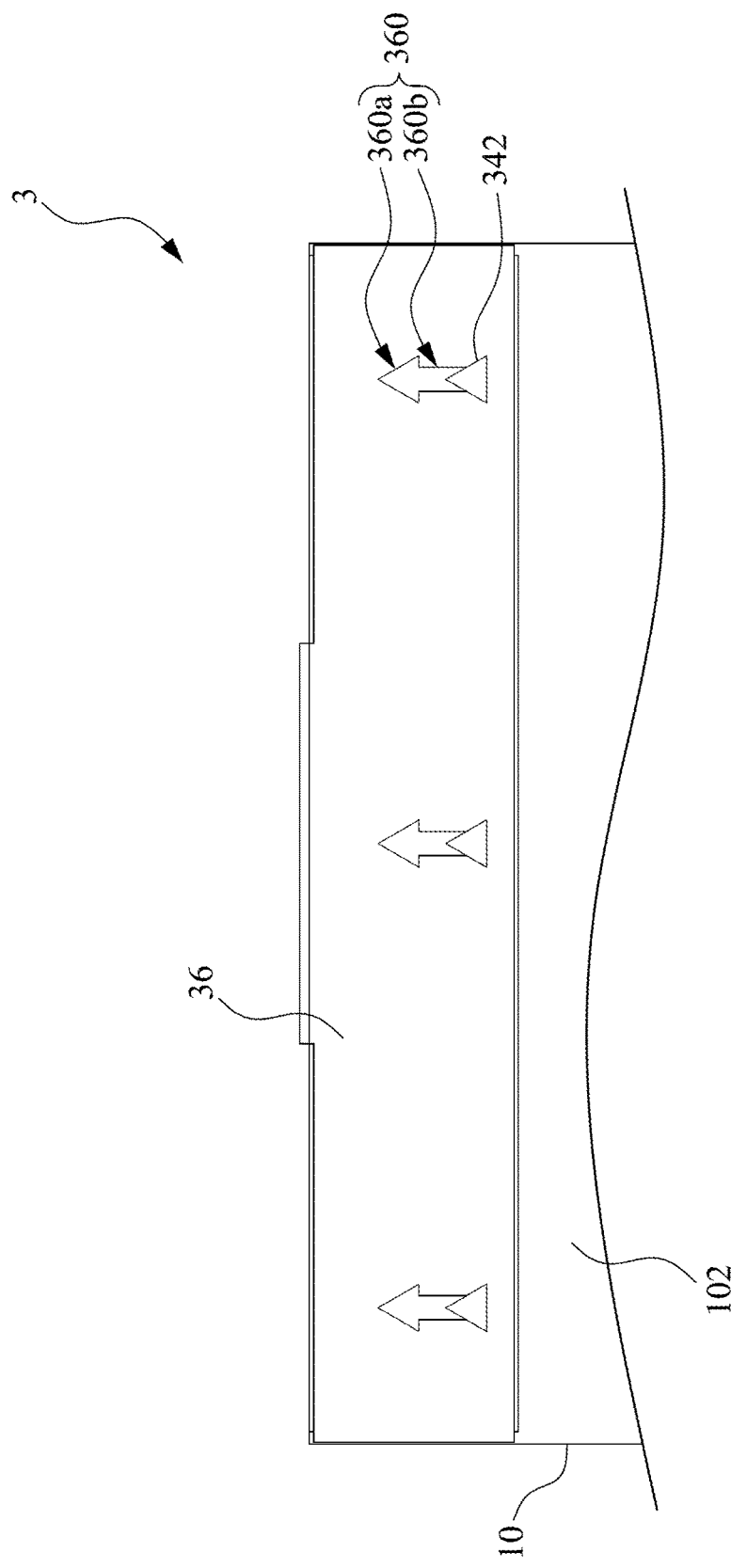
FIG. 5 is a bottom view of a panel assembly according to another embodiment.

FIG. 5 is a bottom view of a panel assembly 3 according to another embodiment. As shown in FIG. 5, in the embodiment, the flexible circuit board 36 of the panel assembly 3 has a plurality of through hole 360, and each of the through hole 360 has a passing zone 360a and an inwardly reduced zone 360b communicated with each other. Compared with the embodiment in FIG. 3, the shape of the passing zone 360a and the shape of the head portion 342 are substantially triangular. When the assembling staff moves the flexible circuit board 36 to align the passing zone 360a with the head portion 342, the purpose of making the head portion 342 pass through the passing zone 360a or leave the through hole 360 can also be achieved.

Figure 6:
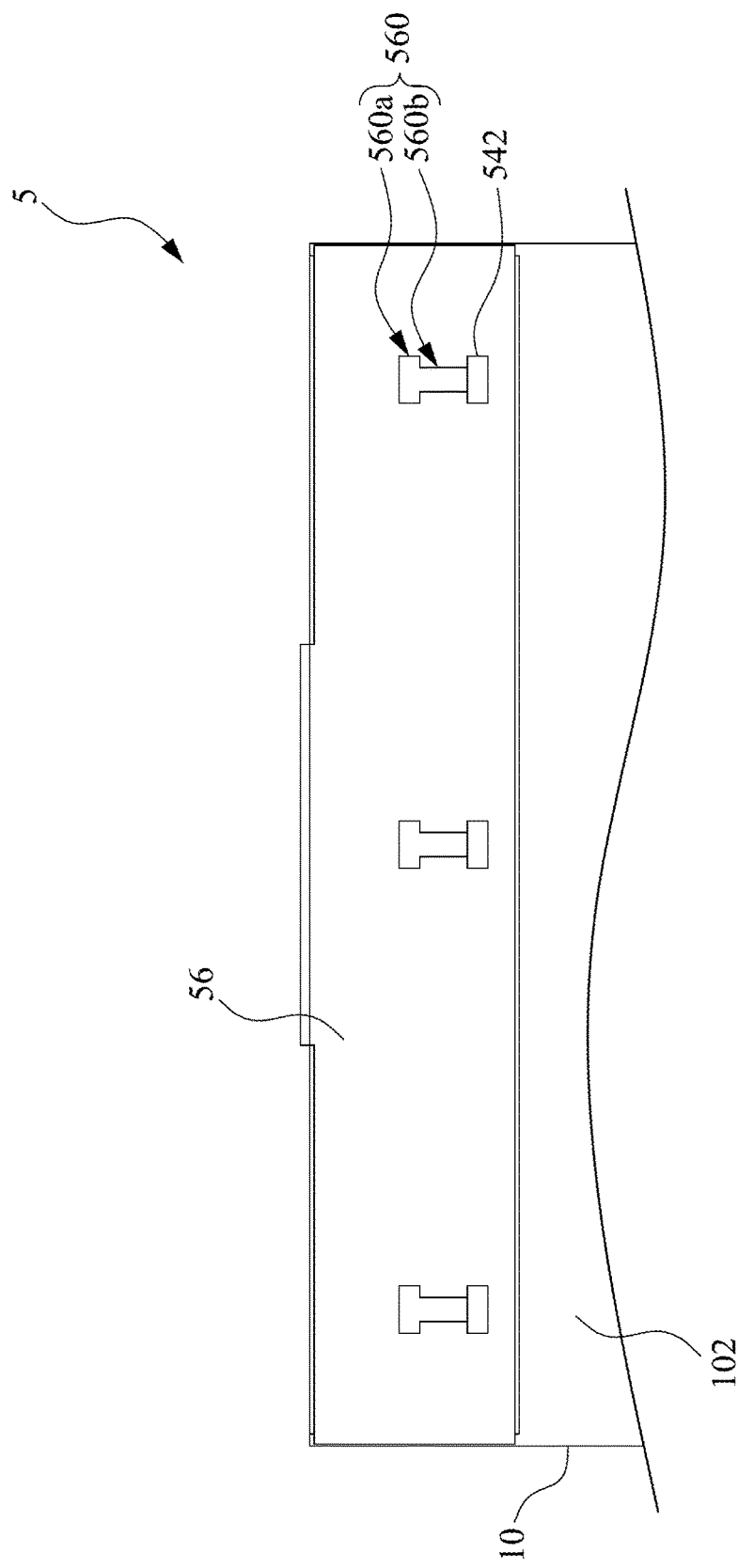
FIG. 6 is a bottom view of a panel assembly according to another embodiment.

FIG. 6 is a bottom view of a panel assembly 5 according to another embodiment. As shown in FIG. 6, in the embodiment, the flexible circuit board 56 of the panel assembly 5 has a plurality of through hole 560, and each of the through hole 560 has a passing zone 560a and an inwardly reduced zone 560b communicated with each other. Compared with the embodiment in FIG. 3, the shape of the passing zone 560a and the shape of the head portion 542 are substantially rectangular. When the assembling staff moves the flexible circuit board 56 to align the passing zone 560a with the head portion 542, the purpose of making the head portion 542 pass through the passing zone 560a or leave the through hole 560 can also be achieved.

According to the foregoing recitations of the embodiments of the disclosure, it can be seen that in the panel assembly of the disclosure, the retaining structure is disposed on the back surface (i.e., the second surface) of the frame, and the through hole for the retaining structure to pass through is formed on the flexible circuit board. Specifically, the passing zone of the through hole is configured for the head portion of the retaining structure to pass through, and the inwardly reduced zone of the through hole does not allow the head portion to pass through. Therefore, when the head portion passes through the passing zone and the flexible circuit board is moved to locate the retaining structure at the inwardly reduced zone, the head portion can stop the flexible circuit board moving away from the second surface, so as to achieve the purpose of preventing the bended flexible circuit board from recovering. In addition, the design of the disclosure used to position the flexible circuit board does not damage the frame.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A panel assembly, comprising:
   a frame having a first surface and a second surface respectively located at opposite sides of the frame;
   a cell module disposed on the first surface;
   a retaining structure disposed on the second surface and comprising:
     a neck portion connected to the second surface; and
     a head portion connected to the neck portion; and
   a flexible circuit board connected to the cell module and bended to extend over the second surface, the flexible circuit board having a through hole, the through hole having a passing zone and an inwardly reduced zone communicated with each other, wherein the neck portion extends to a side of the flexible circuit board distal to the second surface via the inwardly reduced zone, the head portion is configured to prevent the flexible circuit board from moving away from the second surface, and the passing zone is configured for the head portion to pass through,
   wherein when the neck portion contacts an end of the inwardly reduced zone distal to the passing zone, an orthogonal projection of the head portion on the side of the flexible circuit board is apart from the passing zone.

2. The panel assembly of claim 1, wherein a largest width of the head portion is greater than a largest width of the inwardly reduced zone.

3. The panel assembly of claim 1, wherein the shape of the passing zone and the shape of the head portion are matched with each other.

4. The panel assembly of claim 3, wherein the shape of the passing zone and the shape of the head portion are substantially circular.

5. The panel assembly of claim 3, wherein the shape of the passing zone and the shape of the head portion are substantially triangular.

6. The panel assembly of claim 3, wherein the shape of the passing zone and the shape of the head portion are substantially rectangular.

7. The panel assembly of claim 1, wherein the flexible circuit board has a bended portion, and the passing zone is located between the bended portion and the inwardly reduced zone.

8. The panel assembly of claim 1, wherein the cell module comprises:
   a thin-film transistor substrate disposed on the first surface and having a bonding surface facing away from the first surface; and a color filter substrate disposed on the bonding surface, wherein the flexible circuit board is connected to a part of the bonding surface that is not covered by the color filter substrate.

9. The panel assembly of claim 1, wherein the frame and the retaining structure are integrally formed.

* * * * *